(12) United States Patent
Chen et al.

(10) Patent No.: US 7,172,940 B1
(45) Date of Patent: Feb. 6, 2007

(54) METHOD OF FABRICATING AN EMBEDDED NON-VOLATILE MEMORY DEVICE

(75) Inventors: Hsin-Ming Chen, Tainan Hsien (TW); Hai-Ming Lee, Taipei (TW); Shih-Jye Shen, Hsin-Chu (TW); Ching-Hsiang Hsu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 11/162,572

(22) Filed: Sep. 15, 2005

(51) Int. Cl.
*H01L 21/8247* (2006.01)

(52) U.S. Cl. ...................... 438/258; 438/954
(58) Field of Classification Search ........ 438/257–267, 438/954; 257/E21.18
See application file for complete search history.

(56) References Cited

U.S. PATENT DOCUMENTS

| 5,098,855 | A | * | 3/1992 | Komori et al. ............. 438/200 |
| 5,175,120 | A | * | 12/1992 | Lee ............................ 438/201 |
| 5,550,072 | A | * | 8/1996 | Cacharelis et al. ......... 438/201 |
| 6,090,666 | A | * | 7/2000 | Ueda et al. ................. 438/257 |
| 6,303,418 | B1 | * | 10/2001 | Cha et al. ................... 438/199 |
| 6,406,960 | B1 | * | 6/2002 | Hopper et al. .............. 438/261 |

* cited by examiner

Primary Examiner—Richard A. Booth
(74) Attorney, Agent, or Firm—Winston Hsu

(57) ABSTRACT

A method of fabricating a non-volatile memory based on SONOS is disclosed. By masking the peripheral circuit area with a reverse ONO photoresist layer, the residual ONO layer that is not covered by a gate within the memory array area is etched away to expose the substrate. After the etching of the ONO layer, a channel adjustment doping is carried out subsequently using the reverse ONO photoresist layer as an implant mask, thereby forming lightly doped regions next to the gate within the memory array area. Finally, the reverse ONO photoresist layer is then stripped.

7 Claims, 12 Drawing Sheets

METHOD OF FABRICATING AN EMBEDDED NON-VOLATILE MEMORY DEVICE

BACKGROUND OF THE INVENTION

1. Field of the Invention

The present invention relates generally to the field of semiconductor fabrication and, more particularly, to a method of fabricating an embedded non-volatile memory device.

2. Description of the Prior Art

With increasing integration of electrical circuit elements, the trend of manufacturing semiconductor integrated circuits is to integrate memory array region and high-speed logic circuit elements into a single chip to form an embedded memory. The embedded memory not only significantly reduces the circuit area but also greatly increases the signal processing speed.

SONOS technology has been considered as a replacement for floating gate nonvolatile memory due to the simplicity of the bitcell structure and process, high scalability, low voltage operation, and its immunity to extrinsic charge loss and tail bits. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium. A conducting gate layer is placed over the upper silicon dioxide layer.

According to the prior art method of fabricating an embedded non-volatile memory, an additional photo mask is necessary to open the memory array region of the embedded memory device merely for channel adjustment of the memory array. This photo mask blocks the peripheral region of the embedded memory device. The channel adjustment of the memory array can be performed by an additional implant stage of lightly doped drain regions or well implant. It is desirable to save manufacture cost of fabricating non-volatile memory devices by simplifying the process steps or reducing the number of photo masks employed in the fabrication of such devices.

SUMMARY OF THE INVENTION

It is the primary object of the present invention to provide an improved method to solve the above-described problems.

According to the claimed invention, a method of fabricating a non-volatile memory is provided. A semiconductor substrate having thereon a memory array region and a peripheral region is prepared. A device isolation structure is formed on the semiconductor substrate. The device isolation structure isolates a first active area and a second active area within the peripheral region. A charge storage structure is formed on the semiconductor substrate. The charge storage structure is removed from the peripheral region. A first gate oxide layer is formed on the first active area and a second gate oxide layer is formed on the second active area within the peripheral region. A first gate is formed on the first gate oxide layer and a second gate formed on the second oxide layer within the peripheral region, and a third gate formed on the charge storage structure within the memory array region. A photoresist pattern masks the peripheral region but exposes the memory array region. The charge storage structure not covered by the third gate within the memory array region is etched away. The memory array region is implanted by using the photoresist pattern and the third gate as an implant mask to form lightly doped drain regions in the semiconductor substrate adjacent to the third gate. The photoresist pattern is then stripped.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
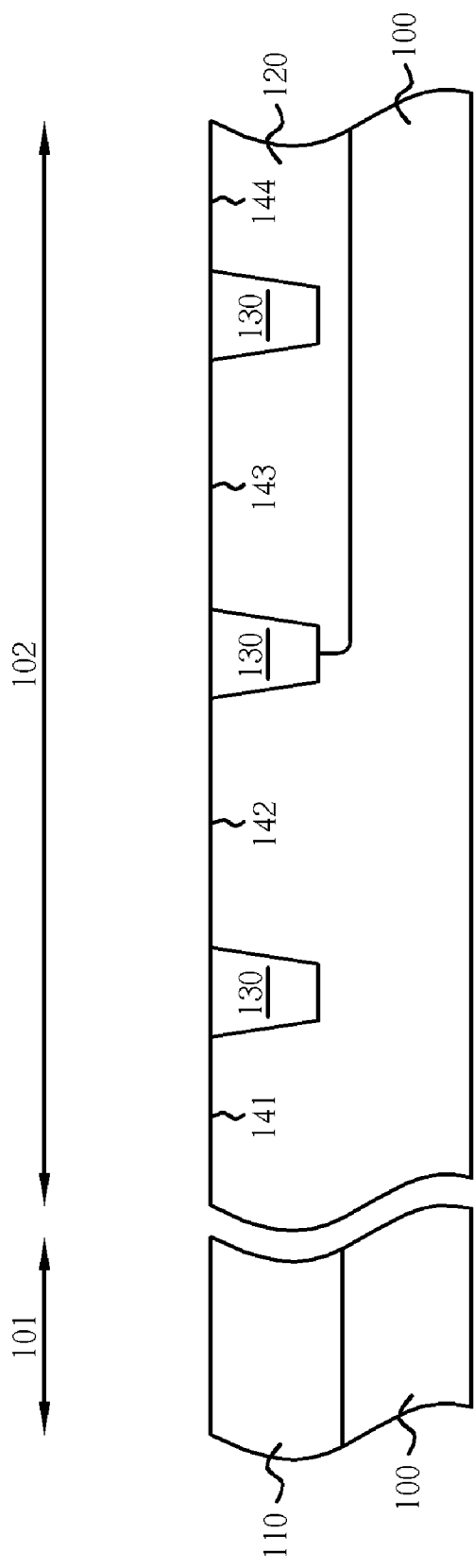
FIG. 1 to FIG. 12 are schematic cross-sectional diagrams illustrating the process of manufacturing an SONOS type embedded non-volatile memory device in accordance with one preferred embodiment of this invention.

Please refer to FIG. 1 to FIG. 12. FIG. 1 to FIG. 12 are schematic cross-sectional diagrams illustrating the process of manufacturing an SONOS type embedded non-volatile memory device in accordance with one preferred embodiment of this invention. As shown in FIG. 1, a semiconductor substrate 100 such as a P type silicon substrate is provided. The semiconductor substrate 100 is divided into at least two regions including a memory array region 101 and a peripheral region 102. N type cell well 110 and N type ion well 120 are formed in the semiconductor substrate 100 within the memory array region 101 and the peripheral region 102, respectively, by using conventional ion implantation methods. After the implantation of ion wells, device isolation structures 130 such as shallow trench isolation (STI) are formed on the semiconductor substrate 100. In another case, the device isolation structures 130 may be formed prior to the implantation of the ion wells 110 and 120.

For the sake of simplicity, only four active areas 141–144, which are isolated by the device isolation structures 130 within the peripheral region 102, are demonstrated in the figures. In the following processes, a high-voltage NMOS transistor, a low-voltage NMOS transistor, a high-voltage PMOS transistor and a low-voltage PMOS transistor will be formed in the active areas 141–144, respectively. According to another preferred embodiment, the peripheral region 102 comprises NMOS transistors and PMOS transistor, while all logic devices' gate oxide formed in the peripheral region 102 is of the same thickness. The manufacturing cost can be further cut down due to the process simplicity.

Figure 2:
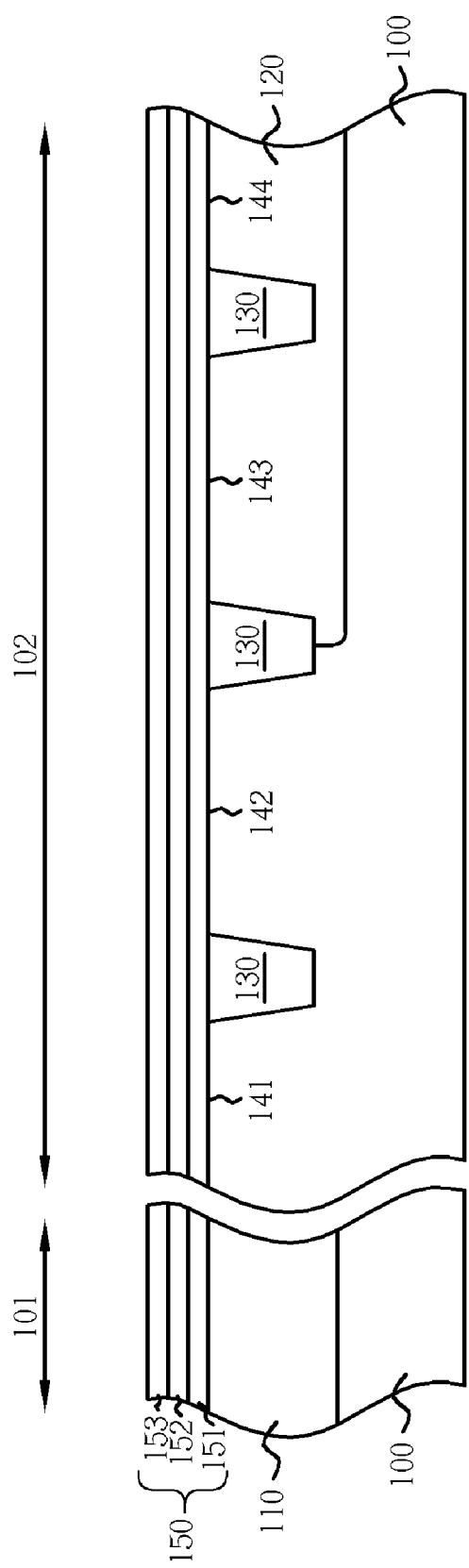

As shown in FIG. 2, an ONO process is performed to form oxide-nitride-oxide (ONO) stack 150 over the semiconductor substrate 100. The ONO stack 150 includes a lower silicon oxide layer 151, a silicon nitride trapping layer 152 and an upper silicon oxide layer 153. According to the invention, the lower silicon oxide layer 151 has thickness of about 20–35 angstroms, the silicon nitride trapping layer 152 has a thickness of about 50–100 angstroms, and the upper silicon oxide layer 153 has a thickness of about 45–100 angstroms. As previously mentioned, the ONO stack functions as a charge storage structure. It is appreciated that an NO stack comprising a lower silicon oxide layer and a silicon nitride or silicon oxynitride strapping layer, or a charge storage structure comprising an oxide layer and a nanocrystal layer may be employed in other preferred embodiments.

Figure 3:
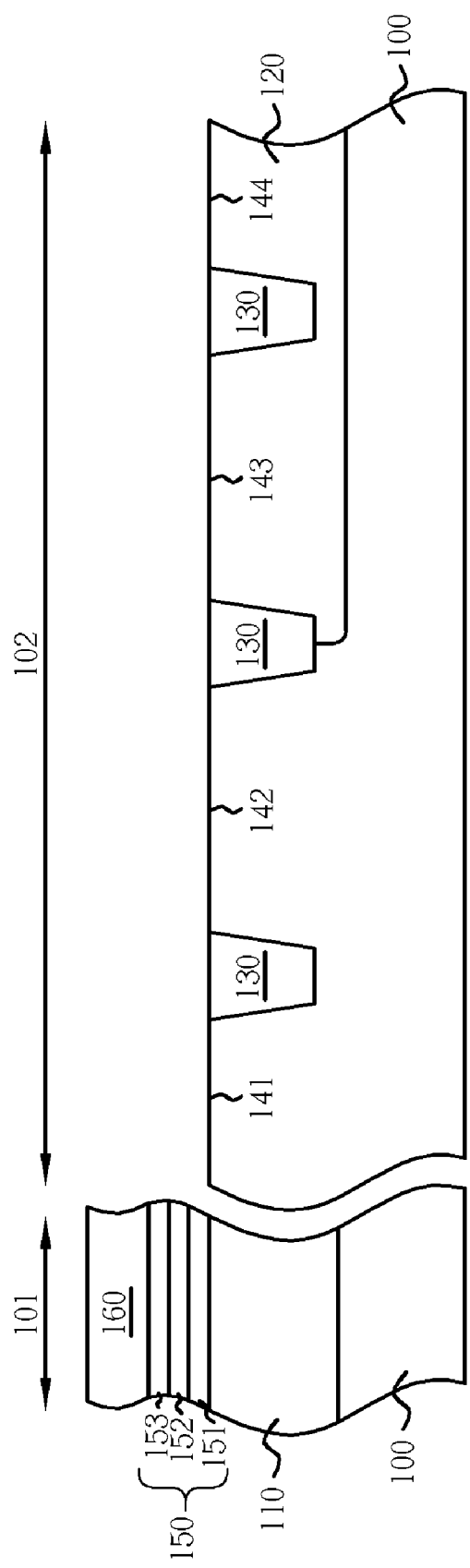

As shown in FIG. 3, a photoresist mask 160 is formed on the ONO stack 150. The photoresist mask 160 exposes the peripheral region 102, but masks the memory array region 101. Using the photoresist mask 160 as etching hard mask, a dry etching process is carried out to etch away the exposed ONO stack 150. The photoresist mask 160 is then removed.

Figure 4:
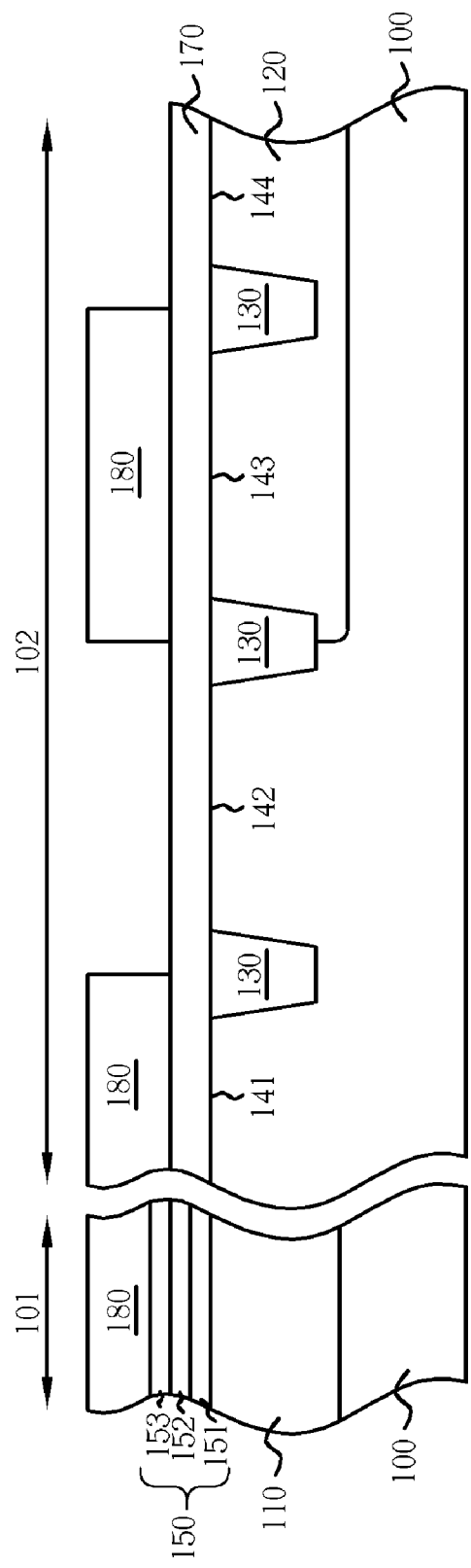

As shown in FIG. 4, a thick oxide layer 170, which acts as a gate oxide layer of the high-voltage MOS transistors to be formed in the peripheral region 102, is grown on the semiconductor substrate 100 within the peripheral region 102 by using thermal oxidation methods known in the art. Subsequently, a photoresist pattern 180 is formed on the semiconductor substrate 100. The photoresist pattern 180 masks the memory array region 101 and high-voltage areas of the peripheral region 102, but exposes the low-voltage areas of the peripheral region 102 in which low-voltage MOS transistors are to be formed.

Figure 5:
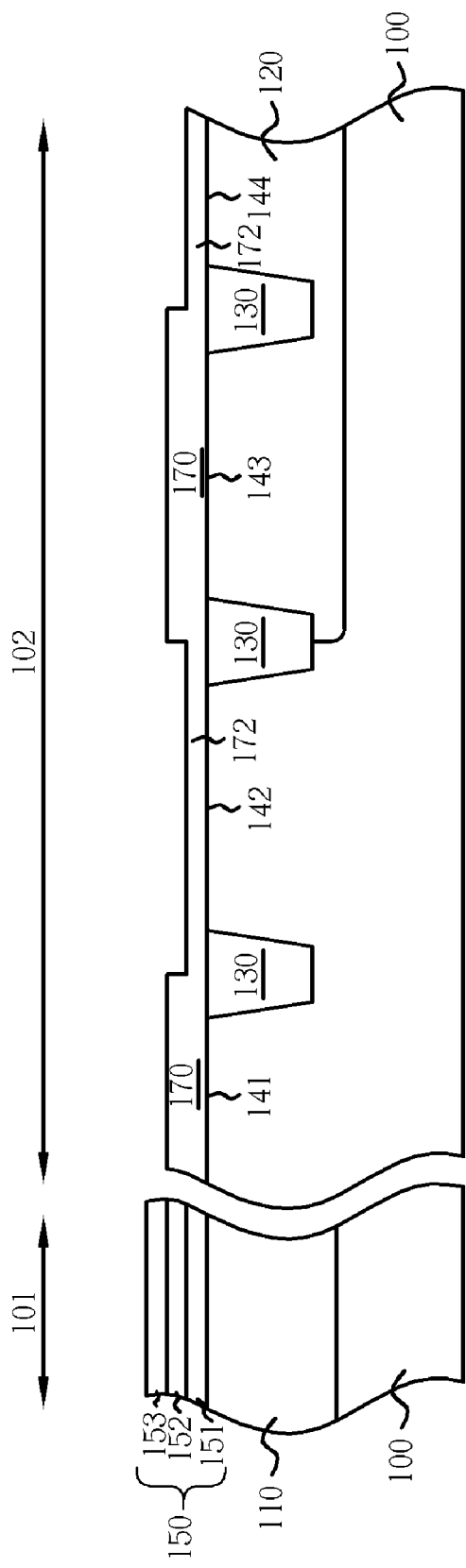

As shown in FIG. 5, using the photoresist pattern 180 as an etching hard mask, the exposed silicon oxide layer 170 in the low-voltage areas are removed. The photoresist pattern 180 is then stripped. Thereafter, a thin silicon oxide layer 172 is grown on the low-voltage areas. The thin silicon oxide layer 172 acts as a gate oxide layer of the low-voltage MOS transistors to be formed in the peripheral region 102. Of course, there are other ways to form gate oxide layers having different thicknesses. The above-described process steps of forming the gate oxide layers of different thicknesses are exemplary, and should not be limiting.

Figure 6:
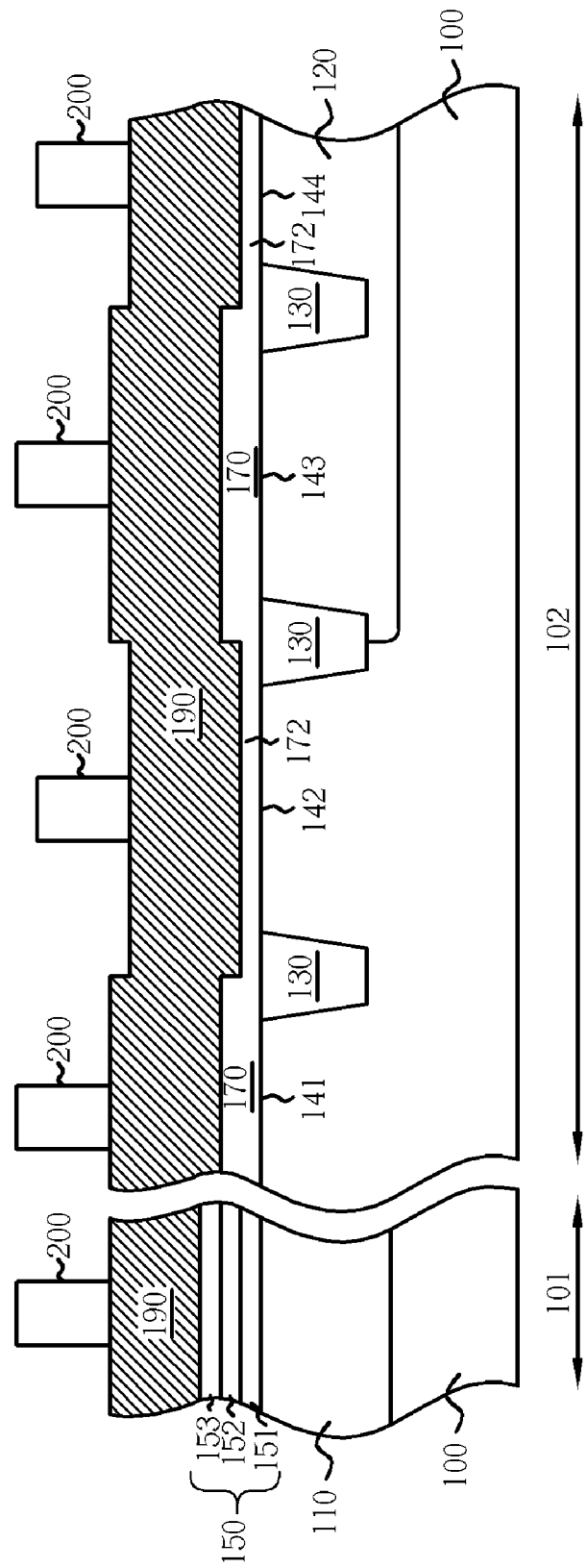

As shown in FIG. 6, a polysilicon layer 190 is deposited on the memory array region 101 and the peripheral region 102. A photoresist pattern 200, which defines the gate patterns of transistors to be formed in the memory array region 101 and the peripheral region 102, is formed on the polysilicon layer 190.

Figure 7:
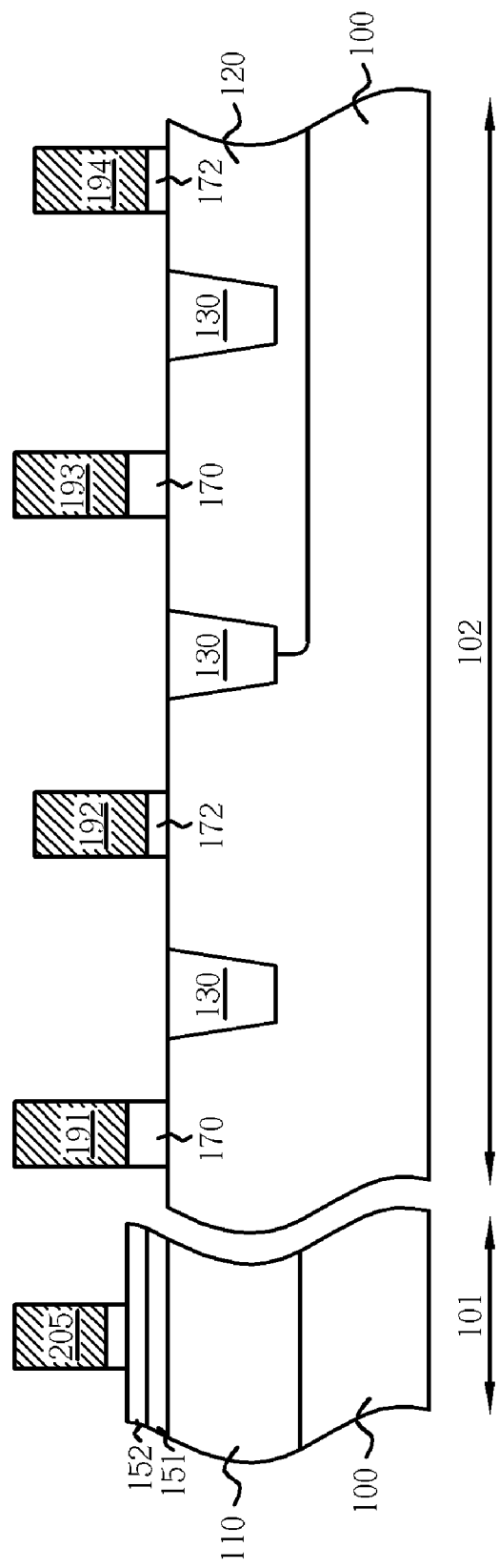

As shown in FIG. 7, using the photoresist pattern 200 as an etching hard mask, an anisotropic dry etching process is performed to etch away the polysilicon layer 190 and the silicon oxide layers 170 and 172 that are not covered by the photoresist pattern 200, thereby forming gate structures 191–194 in the peripheral region 102 and gate structure 205 in the memory array region 101. It is noted that in the memory array region 101, the dry etching substantially stops on the silicon nitride trapping layer 152 of the ONO stack 150. After poly etching process completes, the photoresist 200 is then stripped.

Figure 8:
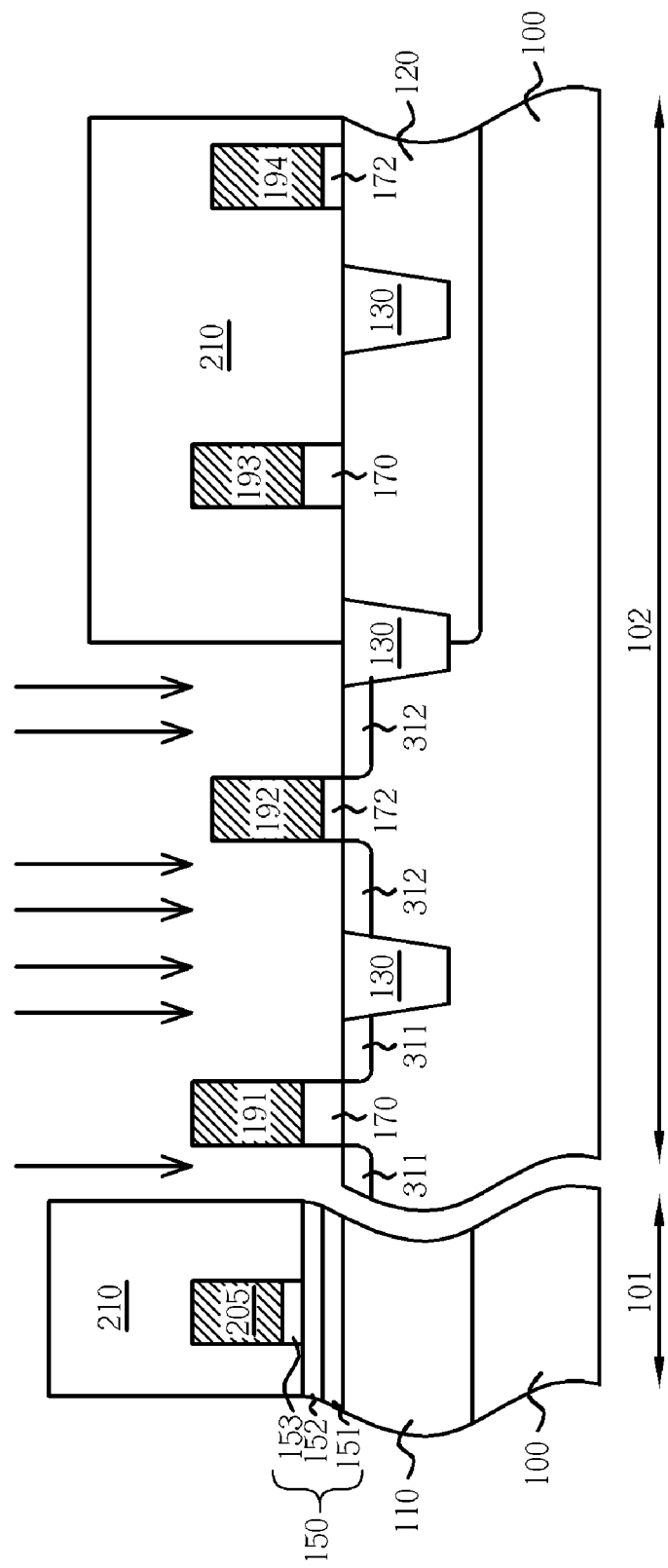

As shown in FIG. 8, a photoresist pattern 210 is formed on the semiconductor substrate 100. The photoresist pattern 210 masks the memory array region 101 and the PMOS transistor region (active areas 143 and 144) of the peripheral region 102, but exposes the NMOS transistor region (active areas 141 and 142) of the peripheral region 102. Using the photoresist pattern 210 and the gate structures 191 and 192 as an implant mask, an ion implantation process is carried out to form lightly doped drain regions 311 and 312 adjacent to the gate structures 191 and 192 respectively. In another case, an oblique ion implantation process may be employed to form pocket doping regions (not shown) directly underneath the gate structures 191 and 192. The photoresist pattern 210 is then stripped.

Figure 9:
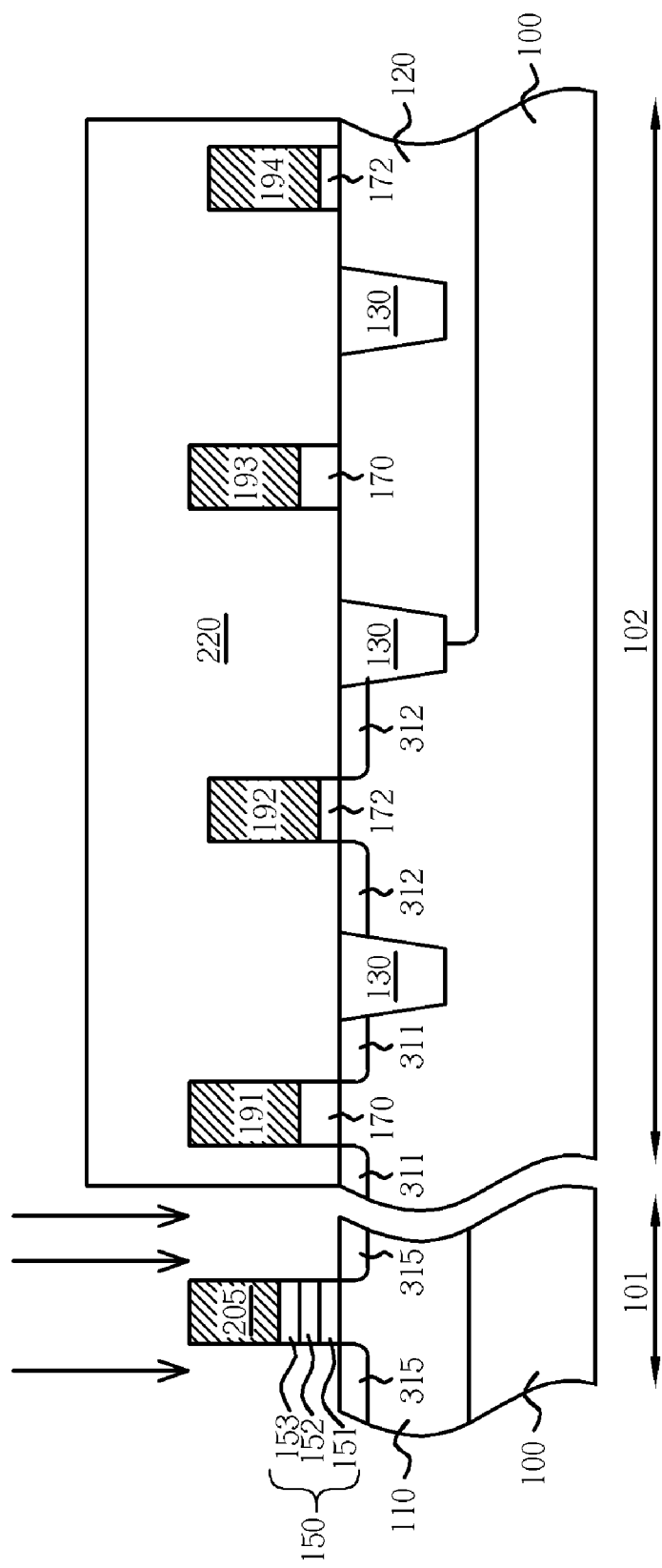

As shown in FIG. 9, a photoresist pattern 220 is formed on the semiconductor substrate 100. The photoresist pattern 220 masks the peripheral region 102, but exposes the memory array region 101. Thereafter, using the photoresist pattern 220 and the gate structure 205 as an etching hard mask, a dry etching process is performed to etch away the remaining silicon nitride trapping layer 152 and the lower silicon oxide layer 151 in the memory array region 101. Subsequently, using the same photoresist pattern 220 as implant mask, several ion implantation processes are carried out to form P type lightly doped drain structures 315 adjacent to the gate structure 205, thereby adjusting the electrical property of the channel regions of the memory array region 101. After the implantation, the photoresist pattern 220 is stripped.

It is the salient feature of the present invention that the adjustment of electrical property of the channel regions of the memory devices to be formed within the memory array region 101 is performed independently of the peripheral region 102. The etching of the remaining ONO stack 150 and the formation of the P type lightly doped drain structures 315 are done by using the same photoresist pattern 220 and the same photo mask as well. A reduction to manufacturing cost by eliminating an extra implant masking step is introduced in this innovative embodiment.

Figure 10:
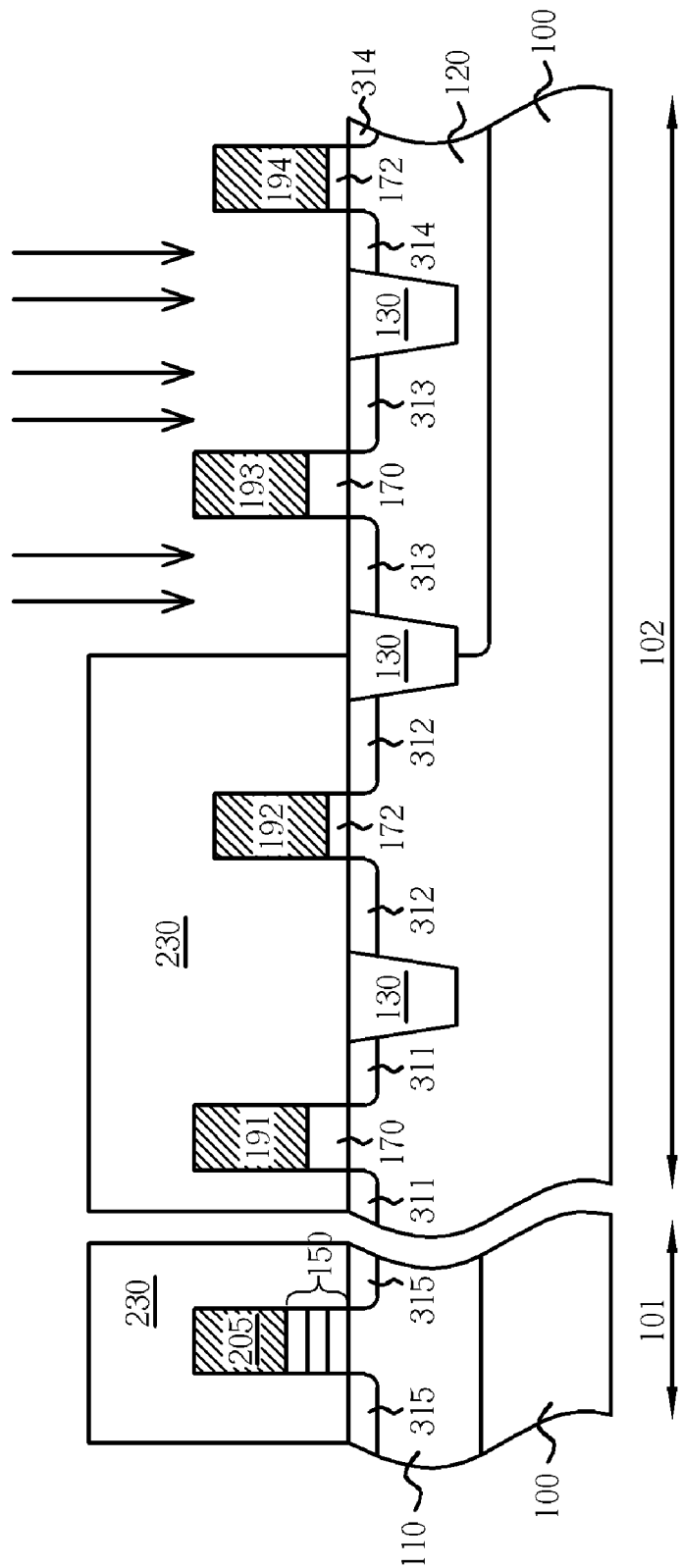

As shown in FIG. 10, a photoresist pattern 230 is formed on the semiconductor substrate 100. The photoresist pattern 230 masks the memory array region 101 and NMOS transistor region (active areas 141 and 142) of the peripheral region 102, but exposes the PMOS transistor region (active areas 143 and 144). Using the photoresist pattern 230 and the gate structures 193 and 194 as an implant mask, an ion implantation process is carried out to form lightly doped drain regions 313 and 314 adjacent to the gate structures 193 and 194 respectively.

As shown in FIG. 1, spacers 400 are formed on sidewalls of the gate structures. The formation of the sidewall spacers typically includes the steps of depositing a conformal dielectric layer such as a silicon oxide layer or a silicon nitride over the semiconductor substrate 100, followed by anisotropic dry etching the dielectric layer. Thereafter, a photoresist pattern 240 is formed on the semiconductor substrate 100. The photoresist pattern 240 masks the NMOS transistor region (active areas 141 and 142), but exposes the memory array region 101 and the PMOS transistor region (active areas 143 and 144). Using the photoresist pattern 240 as an implant mask, an ion implantation process is performed to form source/drain heavy doping regions 323, 324 and 325 adjacent to the gate structures 193, 194 and 205 respectively.

Figure 12:
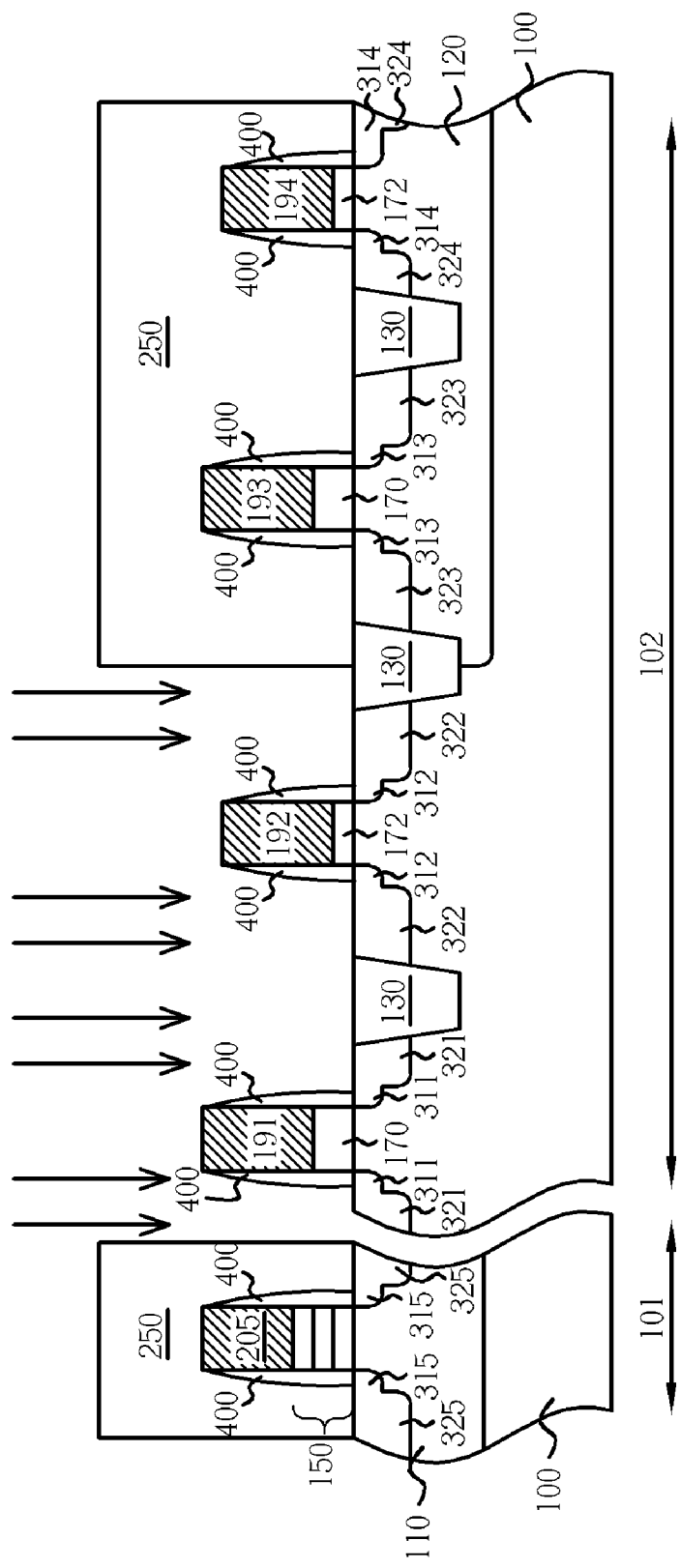

Finally, as shown in FIG. 12, a photoresist pattern 250 is formed on the semiconductor substrate 100. The photoresist pattern 250 masks the memory array region 101 and the PMOS transistor region (active areas 143 and 144) of the peripheral region 102, but exposes the NMOS transistor region (active areas 141 and 142) of the peripheral region 102. Using the photoresist pattern 250 as an implant mask, an ion implantation process is performed to form source/drain heavy doping regions 321 and 322 adjacent to the gate structures 191 and 192, respectively.

Figure 11:
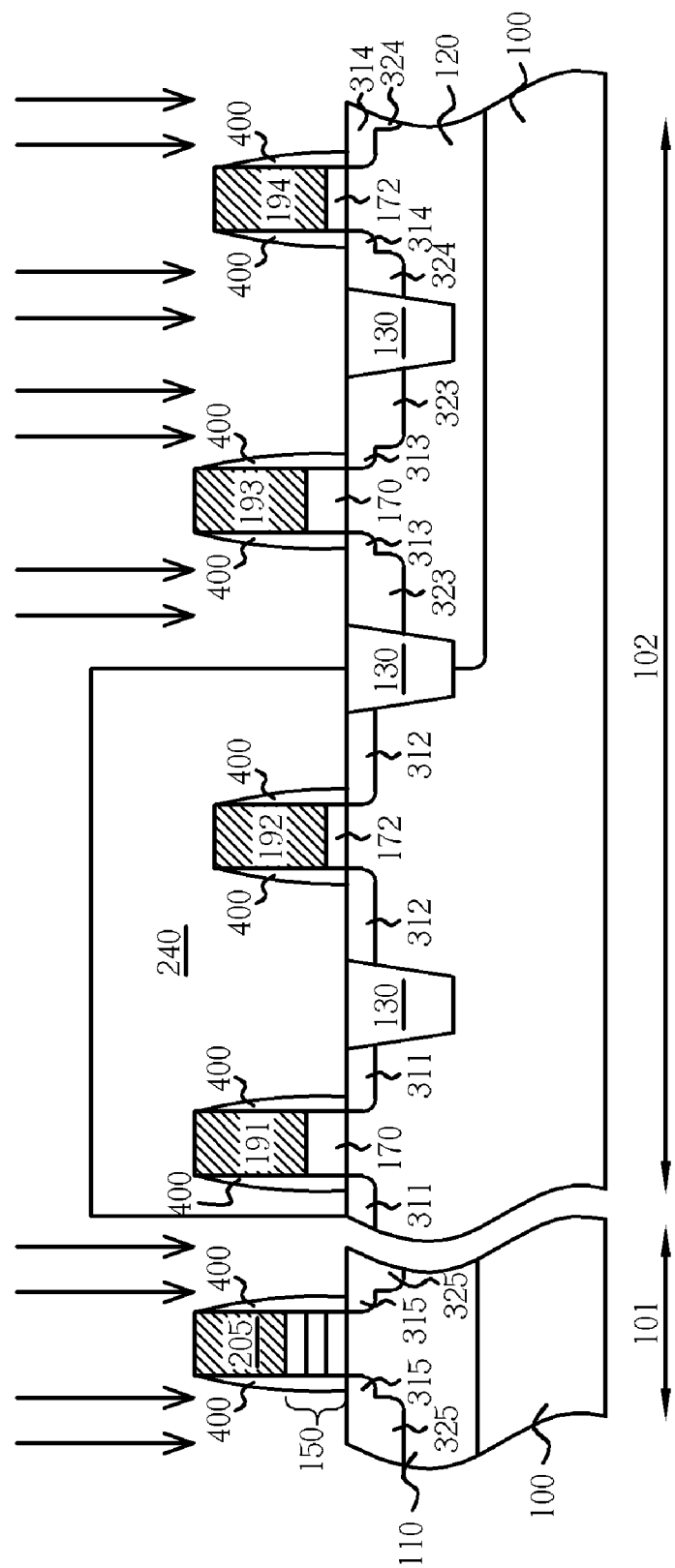

It is noted that the sequence of the ion implantation processes as set forth in FIG. 8, FIG. 9 and FIG. 10 is not important and may be interchangeable depending on the requirements of process integration or device properties. In another case, the ion implantation for forming the source/drain heavy doping regions 321 and 322 (FIG. 12) may be performed prior to the ion implantation for forming the source/drain heavy doping regions 323, 324 and 325 (FIG. 11).

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of fabricating a single-poly non-volatile memory, comprising:

providing a semiconductor substrate having thereon a memory array region and a peripheral region;

forming a device isolation structure on said semiconductor substrate, said device isolation structure isolating a first active area and a second active area within said peripheral region;

forming a charge storage structure on said semiconductor substrate;

removing said charge storage structure from said peripheral region;

forming a first gate oxide layer on said first active area and a second gate oxide layer on said second active area within said peripheral region;

forming a first gate on said first gate oxide layer and a second gate on said second oxide layer within said peripheral region, and a third gate on said charge storage structure within said memory array region, concurrently;

forming a photoresist pattern masking said peripheral region but exposing entire said memory array region;

etching away said charge storage structure not covered by said third gate within said memory array region, wherein said third gate and said photoresist pattern together act as an etching hard mask;

implanting said memory array region by using said photoresist pattern and said third gate as an implant mask to form lightly doped drain regions in said semiconductor substrate adjacent to said third gate; and stripping said photoresist pattern.

2. The method according to claim 1 wherein said charge storage structure is an ONO stack comprising a lower silicon oxide layer, a silicon nitride or silicon oxynitride trapping layer, and a upper silicon oxide layer.

3. The method according to claim 1 wherein said charge storage structure is an NO stack comprising a lower silicon oxide layer and a silicon nitride or silicon oxynitride trapping layer.

4. The method according to claim 1 wherein said charge storage structure comprises an oxide layer and a nanocrystal layer.

5. The method according to claim 1 wherein said first gate oxide layer has a thickness greater than that of said second gate oxide layer.

6. The method according to claim 1 wherein said first gate oxide layer has a thickness equal to that of said second gate oxide layer.

7. The method according to claim 1 wherein said memory array region comprises transistors having said charge storage structure and transistors without said charge storage structure.

* * * * *